US008086041B2

(12) United States Patent
Mitsui

(10) Patent No.: US 8,086,041 B2
(45) Date of Patent: Dec. 27, 2011

(54) PATTERN EVALUATION METHOD, PATTERN MATCHING METHOD AND COMPUTER READABLE MEDIUM

(75) Inventor: Tadashi Mitsui, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/659,294

(22) Filed: Mar. 3, 2010

(65) Prior Publication Data
US 2010/0158389 A1   Jun. 24, 2010

Related U.S. Application Data

(62) Division of application No. 11/391,197, filed on Mar. 29, 2006, now Pat. No. 7,702,157.

(30) Foreign Application Priority Data

Mar. 30, 2005  (JP) ................................ 2005-098513
Mar. 30, 2005  (JP) ................................ 2005-099052

(51) Int. Cl.
    G06K 9/48          (2006.01)
(52) U.S. Cl. ........................................ 382/199; 382/149
(58) Field of Classification Search .................. 382/144, 382/145, 146, 147, 149
    See application file for complete search history.

(56) References Cited

U.S. PATENT DOCUMENTS

| 4,477,926 | A | * | 10/1984 | Linger et al. .................. 382/149 |
| 5,982,922 | A | * | 11/1999 | Moriya .......................... 382/149 |
| 6,064,484 | A |   | 5/2000  | Kobayashi et al. |
| 6,148,097 | A | * | 11/2000 | Nakayama et al. ........... 382/141 |
| 6,413,688 | B2 |  | 7/2002  | Akutagawa et al. |
| 6,538,260 | B1 |  | 3/2003  | Koga |
| 6,868,175 | B1 |  | 3/2005  | Yamamoto et al. |
| 7,076,093 | B2 |  | 7/2006  | Lee et al. |

(Continued)

FOREIGN PATENT DOCUMENTS

JP     55-028112     2/1980

(Continued)

OTHER PUBLICATIONS

Notification of Reasons for Rejection issued by the Japanese Patent Office on Aug. 13, 2010, for Japanese Patent Application No. 2005-098513, and English-language translation.

(Continued)

*Primary Examiner* — Jon Chang
(74) *Attorney, Agent, or Firm* — Finnegan, Henderson, Farabow, Garrett & Dunner, L.L.P.

(57) ABSTRACT

A pattern evaluation method includes: generating first array data from edge data on a pattern to be evaluated, the edge data on the pattern to be evaluated being shape data including edge points of the pattern to be evaluated; generating second array data from edge data on a reference pattern, the edge data on the reference pattern including edge points of the reference pattern which serves as an inspection standard of the pattern to be evaluated; subjecting each component of the second array data to array conversion processing, the array conversion processing being designed to convert a value of the component of the second array data into a function value of a value of a distance from that component to the edge point closest thereto, thereby generating third array data; executing arithmetic processing between the first array data and the third array data to generate fourth array data; and using a component of the fourth array data to calculate a numerical value representative of an relation between the pattern to be evaluated and the reference pattern.

6 Claims, 11 Drawing Sheets

U.S. PATENT DOCUMENTS

2002/0141634 A1* 10/2002 Nishizaka et al. ............ 382/144
2003/0059104 A1 3/2003 Mitsui
2004/0066964 A1 4/2004 Neubauer et al.
2005/0086618 A1 4/2005 Ito et al.

FOREIGN PATENT DOCUMENTS

| JP | 8-194734 | 7/1996 |
|---|---|---|
| JP | 10-111108 | 4/1998 |
| JP | 10-170241 | 6/1998 |
| JP | 2002-277236 | 9/2002 |

OTHER PUBLICATIONS

Notification of Reasons for Rejection for corresponding Japanese Patent Application No. 2005-098513, 3pp.
Notification of Reasons for Rejection issued by the Japanese Patent Office on Sep. 16, 2011, for Japanese Patent Application No. 2011-093110, and English-language translation thereof.
Decision of Final Rejection issued by the Japanese Patent Office on Sep. 16, 2011, for Japanese Patent Application No. 2005-098513, and English-language translation thereof.

* cited by examiner

PATTERN EVALUATION METHOD, PATTERN MATCHING METHOD AND COMPUTER READABLE MEDIUM

This is a division of application Ser. No. 11/391,197, filed Mar. 29, 2006 now U.S. Pat. No. 7,702,157, which is incorporated herein by reference.

CROSS REFERENCE TO RELATED APPLICATION

This application claims benefit of priority under 35USC §119 to Japanese patent applications No. 2005-099052 and No. 2005-098513, filed on Mar. 30, 2005, respectively, the contents of which are incorporated by reference herein.

BACKGROUND OF THE INVENTION

1. Field of the Invention

The present invention relates to a pattern evaluation method, a pattern matching method and a program.

2. Related Background Art

In various industrial fields, there has been widespread adoption of a method of evaluation using, as an index, a difference between the shape of a pattern which is an evaluation target (hereinafter referred to as a pattern to be evaluated) and a reference figure thereof. For example, for the evaluation of a semiconductor device pattern, a scanning electron microscope (SEM) image as an inspection image of the pattern and computer aided design (CAD) data as design data for the SEM image are used to calculate the degree of similarity between a worked shape of the device pattern and a design shape thereof, thereby judging whether or not the pattern is good. One example of such a conventional evaluation method will be described below.

First, the edge of the pattern to be evaluated is detected from the SEM image which is the inspection image. Moreover, when a CAD figure is provided in a binary file such as GDSII as a design pattern, it is uncompressed as a binary image to likewise detect information on the edge of the design pattern.

Next, the SEM image is referred to the binary image to detect the positions of both the patterns. Specifically, the relative positions of both the patterns are gradually changed in a predetermined form, and the degree of difference or similarity at that moment is calculated every time, thereby detecting a position at which the calculated value becomes a maximum or minimum value. For the degree of similarity, the use is generally made of parameters such as a normalized correlation in which the brightness of the image are normalized, or a cross correlation. The edge of the SEM image is superposed on the CAD figure by the above-mentioned image matching.

Subsequently, one or several regions of interest (ROI) is/are set in the superposed patterns, and dimensions between the edges of both the patterns in the ROI are measured. One or several dimensional values thus obtained is/are referred to a separately defined standard to judge whether or not the pattern to be evaluated is acceptable.

However, the conventional technique described above has the following problems.

First, since the correctness of the superposition of the edge of the pattern to be evaluated on the CAD figure depends on the pattern shape, it has been difficult to make a comparison by the degree of coincidence between differently shaped patterns. Further, since it is necessary to sequentially execute image processing of two kinds including the image reference and the calculation of the degree of difference between patterns, there has been a problem of time-consuming calculation, which therefore increases costs for the pattern shape evaluation. In addition, there is no clear standard for a threshold value used for the image matching, and the threshold value is set in dependence upon the experience of an operator under the present circumstances.

Furthermore, in the conventional technique described above, the shape of the pattern is evaluated with several dimensional values, so that there has been a problem that a large number of ROIs have to be set to evaluate a complicated pattern and much effort is needed for the calculation to analyze a large amount of dimensional data thus obtained.

SUMMARY OF THE INVENTION

According to a first aspect of the invention, there is provided a pattern evaluation method comprising:

generating first array data from edge data on a pattern to be evaluated, the edge data on the pattern to be evaluated being shape data including edge points of the pattern to be evaluated;

generating second array data from edge data on a reference pattern, the edge data on the reference pattern including edge points of the reference pattern which serves as an inspection standard of the pattern to be evaluated;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data; and using a component of the fourth array data to calculate a numerical value representative of a relation between the pattern to be evaluated and the reference pattern.

According to a second aspect of the invention, there is provided a pattern evaluation method comprising:

obtaining a first image which is an image of a pattern to be evaluated, detecting edge data from the first image and generating first array data from the detected edge data, the edge data from the first image being shape data including edge points of the pattern to be evaluated;

generating second array data from edge data on a reference pattern which serves as an inspection standard of the pattern to be evaluated, the edge data on the reference pattern being shape data including edge points of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

converting the fourth array data into a second image by mapping index colors with reference to a color table set in accordance with the size of a value of a component of the fourth array data; and displaying the first and second images so that the second image is superposed in the first image.

According to a third aspect of the invention, there is provided a pattern matching method comprising:

generating first array data from edge data on a pattern to be evaluated, the edge data on the pattern to be evaluated being shape data including edge points of the pattern to be evaluated;

generating second array data from edge data on a reference pattern which serves as an inspection standard of the pattern to be evaluated, the edge data on the reference pattern including edge points of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

using a component of the fourth array data to calculate a numerical value representative of an relation between the pattern to be evaluated and the reference pattern; and matching the pattern to be evaluated with the reference pattern on the basis of the calculated numerical value and a set standard.

According to a fourth aspect of the invention, there is provided a computer readable medium storing a program to cause a computer to execute a pattern evaluation method, the pattern evaluation method comprising:

generating first array data from edge data on a pattern to be evaluated, the edge data on the pattern to be evaluated being shape data including edge points of the pattern to be evaluated;

generating second array data from edge data on a reference pattern, the edge data on the reference pattern including edge points of the reference pattern which serves as an inspection standard of the pattern to be evaluated;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data; and using a component of the fourth array data to calculate a numerical value representative of a relation between the pattern to be evaluated and the reference pattern.

According to a fifth aspect of the invention, there is provided a computer readable medium storing a program to cause a computer to execute a pattern evaluation method, the pattern evaluation method comprising:

obtaining a first image which is an image of a pattern to be evaluated, detecting edge data from the first image and generating first array data from the detected edge data, the edge data from the first image being shape data including edge points of the pattern to be evaluated;

generating second array data from edge data on a reference pattern which serves as an inspection standard of the pattern to be evaluated, the edge data on the reference pattern being shape data including edge points of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

converting the fourth array data into a second image by mapping index colors with reference to a color table set in accordance with the size of a value of a component of the fourth array data; and displaying the first and second images so that the second image is superposed in the first image.

According to a sixth aspect of the invention, there is provided a computer readable medium storing a program to cause a computer to execute a pattern evaluation method, the pattern evaluation method comprising:

generating first array data from edge data on a pattern to be evaluated, the edge data on the pattern to be evaluated being shape data including edge points of the pattern to be evaluated;

generating second array data from edge data on a reference pattern which serves as an inspection standard of the pattern to be evaluated, the edge data on the reference pattern including edge points of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

using a component of the fourth array data to calculate a numerical value representative of an relation between the pattern to be evaluated and the reference pattern; and matching the pattern to be evaluated with the reference pattern on the basis of the calculated numerical value and a set standard.

According to a seventh aspect of the invention, there is provided a pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

generating an allowable range of the pattern to be evaluated on the basis of the parameters of the reference pattern and data on the edge thereof;

obtaining a relative positional relation between the edge of the pattern to be evaluated and the allowable range to judge an inclusive relation between the edge of the pattern to be evaluated and the allowable range; and judging whether or not the pattern to be evaluated is good on the basis of an obtained result of judging the inclusive relation.

According to an eighth aspect of the invention, there is provided a pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

matching the pattern to be evaluated with the reference pattern;

generating an allowable range of the pattern to be evaluated on the basis of the parameters of the reference pattern and data on the edge thereof;

superposing the edge of the pattern to be evaluated on the allowable range on the basis of the result of the matching to judge an inclusive relation between the edge and the allowable range; and judging whether or not the pattern to be evaluated is good on the basis of an obtained result of judging the inclusive relation According to a ninth aspect of the invention, there is provided a pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

generating first array data from data on the detected edge of the pattern to be evaluated;

generating second array data from data on the detected edge of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

using a component of the fourth array data to calculate a numerical value representative of an relation between the pattern to be evaluated and the reference pattern; and matching the pattern to be evaluated with the reference pattern on the basis of the calculated numerical value and a set standard;

generating an allowable range of the pattern to be evaluated on the basis of the parameters of the reference pattern and data on the edge thereof;

superposing the edge of the pattern to be evaluated on the allowable range on the basis of the result of the matching to judge an inclusive relation between the edge and the allowable range; and judging whether or not the pattern to be evaluated is good on the basis of an obtained result of judging the inclusive relation.

According to a tenth aspect of the invention, there is provided a computer readable medium storing a program to cause a computer to execute a pattern evaluation method, the pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

generating an allowable range of the pattern to be evaluated on the basis of the parameters of the reference pattern and data on the edge thereof;

obtaining a relative positional relation between the edge of the pattern to be evaluated and the allowable range to judge an inclusive relation between the edge of the pattern to be evaluated and the allowable range; and judging whether or not the pattern to be evaluated is good on the basis of an obtained result of judging the inclusive relation.

According to an eleventh aspect of the invention, there is provided a computer readable medium storing a program to cause a computer to execute a pattern evaluation method, the pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

matching the pattern to be evaluated with the reference pattern;

generating an allowable range of the pattern to be evaluated on the basis of the parameters of the reference pattern and data on the edge thereof;

superposing the edge of the pattern to be evaluated on the allowable range on the basis of the result of the matching to judge an inclusive relation between the edge and the allowable range; and judging whether or not the pattern to be evaluated is good on the basis of an obtained result of judging the inclusive relation.

According to a twelfth aspect of the invention, there is provided a computer readable medium storing a program to cause a computer to execute a pattern evaluation method, the pattern evaluation method comprising:

detecting an edge of a pattern to be evaluated;

detecting an edge of a reference pattern, the reference pattern serving as an evaluation standard of the pattern to be evaluated and being previously provided with parameters indicating an allowable degree of the pattern to be evaluated;

generating first array data from data on the detected edge of the pattern to be evaluated;

generating second array data from data on the detected edge of the reference pattern;

subjecting each component of the second array data to array conversion processing, the array conversion processing being designed to convert a value of the component of the second array data into a function value of a value of a distance from that component to the edge point closest thereto, thereby generating third array data;

executing arithmetic processing between the first array data and the third array data to generate fourth array data;

using a component of the fourth array data to calculate a numerical value representative of an relation between the pattern to be evaluated and the reference pattern; and matching the pattern to be evaluated with the reference pattern on the basis of the calculated numerical value and a set standard;

generating an allowable range of the pattern to be evaluated on the basis of the parameters of the reference pattern and data on the edge thereof;

superposing the edge of the pattern to be evaluated on the allowable range on the basis of the result of the matching to judge an inclusive relation between the edge and the allowable range; and judging whether or not the pattern to be evaluated is good on the basis of an obtained result of judging the inclusive relation.

DETAILED DESCRIPTION OF THE INVENTION

Embodiments of the present invention will be described in reference to the drawings. The following description is given properly taking up a shape inspection of a micropattern formed in a manufacturing process of a semiconductor such as a lithographic process or an etching process. However, it is to be noted that the present invention is not limited to the above cases and is applicable to the evaluation of patterns in general in various other industrial fields.

(1) First Embodiment

Figure 1:
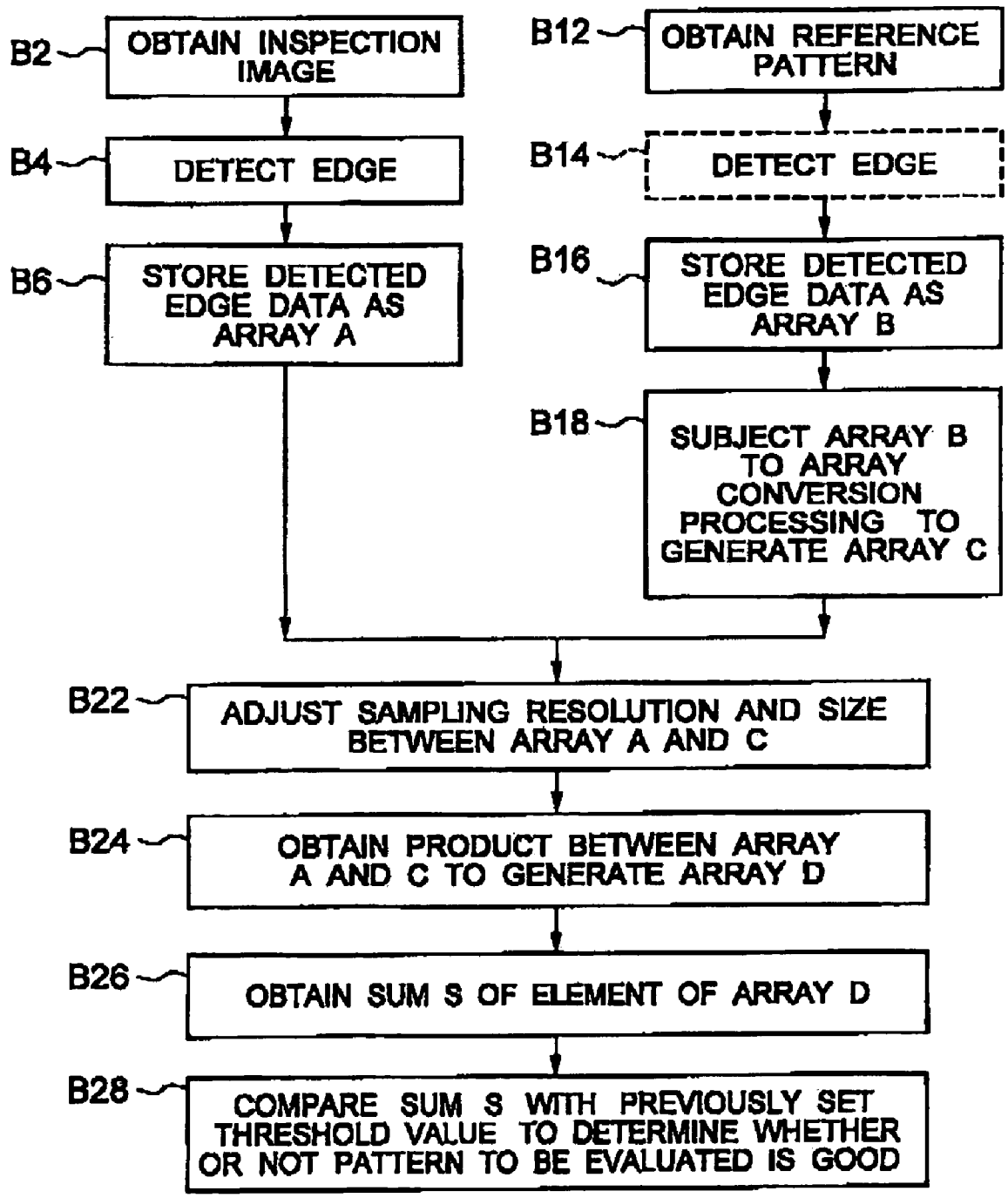
FIG. 1 is a block chart explaining a schematic procedure in a first embodiment of the present invention.
Figure 2:
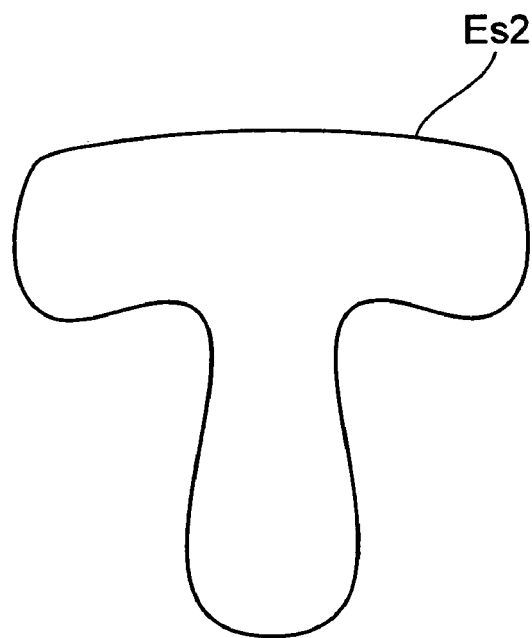
FIG. 2 is a diagram showing one example of the edge of an inspection image of a pattern to be evaluated which is an evaluation target in a pattern evaluation method shown in FIG. 1.
Figure 3:
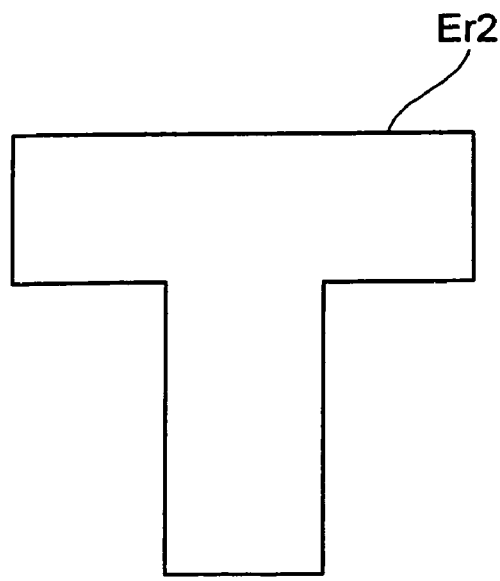
FIG. 3 is a diagram showing one example of a design pattern as a reference pattern of the pattern to be evaluated shown in FIG. 2.

FIG. 1 is a block chart explaining a schematic procedure in a first embodiment of the present invention. Further, FIG. 2 is a diagram showing one example of an inspection image of a pattern to be evaluated which is an evaluation target in a pattern evaluation method shown in FIG. 1. Still further, FIG. 3 is a diagram showing one example of a pattern based on design data (hereinafter simply referred to as "design pattern") as a reference pattern of the pattern to be evaluated shown in FIG. 2. In the present embodiment, the design data is used as the reference pattern, but the reference pattern is not limited thereto, and, for example, an image of a product pattern judged as nondefective may be used. In this case, as will be described later in connection with the inspection image, processing to detect the edge is needed (B14).

Hereinafter, a case will be described by way of example wherein the edge of the inspection image shown in FIG. 2 are referred to the design pattern shown in FIG. 3 to evaluate the shape of the pattern. Here, the position of the inspection image shown in FIG. 2 has been set with reference to the design data by some means. Methods of matching include various methods such as a method using correlative matching of the pattern to be evaluated and the design pattern, and a method to cause centers of gravity to coincide with each other in simpler terms. Whichever matching method is employed, it is important to carry out matching suited to the object of the pattern evaluation.

In the following, image data is treated as array data for a general-purpose explanation. In a case of a gray-scale image, pixel coordinates of the image data correspond to a pointer address of the array data, and a gradation value of the image data corresponds to an element value of the array data. The image data and the array data are different in that normalized 0 and values of natural numbers are only permitted for the gradation value of the image data, while any numerical value including negative numbers and decimals is permitted for the element value of the array data. In the present specification, "array", when simply referred to, means a data structure of the array data, and a two-dimensional array is generally used. However, an optimum data structure may be employed in accordance with a programming language or a computer system for performing calculation, such as a two-dimensional array or a one-dimensional array in a bit plane form.

First, as shown in FIG. 1, an inspection image and design data are read into a computer (B2, B12). Next, an ROI corresponding to a pattern to be evaluated in the inspection image is designated to detect an edge Es2 on the whole periphery of the pattern to be evaluated. A threshold method, a linear approximation method or any other methods may be used to detect the edge Es2 (FIG. 2). Edge points also need to be detected with a sub-pixel resolution, and if an image size in FIG. 2 is 100×100 pixels, edge data detected with a sampling resolution of 1/10 pixels is stored in a storage device of the computer as a 1000×1000 array A having a value 1 at the position of the edge point and a value 0 at other positions.

When the design data (refer to a design pattern Er2 in FIG. 3) is given as binary data, it is rendered into a figure to obtain data on the edge of the design pattern as an array B having a value 1 at the position of the edge point and a value 0 at other positions (FIG. 1, B16). At this moment, the scale of the design pattern Er2 is decided on the basis of the magnification of the inspection image. When the pattern evaluation described later is implemented with sub-pixel accuracy, it is necessary to employ a sampling resolution for edge detection adapted to the array A and store the array B in the storage device of the computer as, for example, a 1000×1000 array. However, it is not always necessary to adapt to the size of the array A, and, for example, the size of the array B may be 500×500. It is rather necessary to select proper degrees of sampling resolutions for both the array A and the array B in order to improve a calculation speed.

Figure 4:
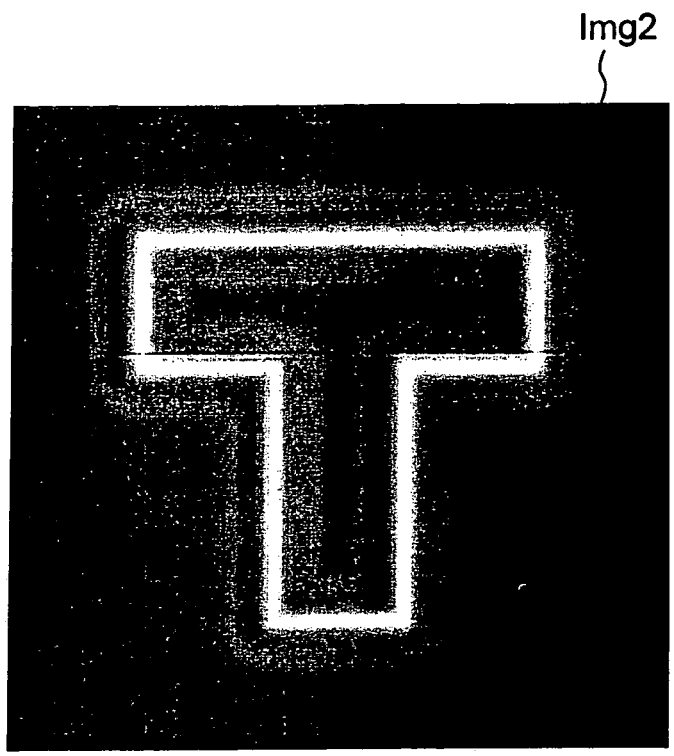
FIG. 4 is an array-converted image of the design pattern shown in FIG. 3.

Next, the array B is subjected to array conversion processing to generate an array C (FIG. 1, B18). In the present embodiment, the array conversion processing means conversion processing in which a shortest distance from each element of the array B to an element having the value 1 is used as a distance value and substituted for the value of that element. In the present embodiment, a Euclidean distance is defined as the distance value to perform the array conversion processing. The distance value can be variably defined, and in addition to the Euclidean distance, it is possible to use, for example, a 4-neighbor distance (city Block), an 8-neighbor distance (chessboard), an octagonal distance or a quasi-Euclidean distance. The distance value is not an integer and can not therefore be used as an image as it is, but it is, for example, possible to normalize the distance value into an 8-bit value to generate an array-converted image. In FIG. 4, there is schematically shown the array C in which the design pattern Er2 shown in FIG. 3 has been subjected to such image conversion processing. In this drawing, a bright part indicates a distance value 0, that is, the edge. As seen in FIG. 4, an edge line becomes farther, that is, the distance value becomes greater with the transition to a darker side in the gradation. When the accuracy in the pattern evaluation is not highly required, this array-converted image can be used for the progress in subsequent processing such that a reduction in calculation time can be expected. However, when highly accurate pattern evaluation is required, the result of the array conversion processing is treated as the array data C at this stage.

Returning to FIG. 1, when the sampling resolutions are different between the array A and the array C, it is necessary to divide the array with a higher resolution into sub-arrays in accordance with the array with a lower resolution (B22), but it is assumed in the present embodiment that the sampling resolutions are the same. Further, when the size of the array A is larger than the size of the array B, it is necessary that the size of the array A be uniform with the size of the array B (B22), but it is also assumed in the present embodiment that the array sizes are the same. Under the above condition, a product is obtained between the elements at the pointer positions corresponding to each other of the array A and the array C, and the result is moved to the same pointer position of an array D of the same size (B24). The array D thus generated retains numerical values including positive and negative signs as array data.

Subsequently, a sum S of elements of the array D is obtained (B26). This sum value S is a sum total of distances between the shape of the pattern to be evaluated and the design pattern, and represents the degree of coincidence of both the patterns. For example, if the shape of the pattern to be evaluated is totally the same as that of the design pattern, the value of S will be 0, and the value of S becomes larger with more deviation from the design pattern.

In accordance with the procedure described above, for example, it is possible to quantitatively judge which of the two different patterns to be evaluated is closer to the designed pattern. It is also possible to set a threshold value of S and judge whether or not the pattern to be evaluated is acceptable from the degree of coincidence between the pattern to be evaluated and the design pattern (B28).

According to the present embodiment, the evaluation and matching can be achieved in a significantly short period of time, so that it is possible to enhance the efficiency of resources of a central processing unit (CPU) used in the processing.

(2) Second Embodiment

The degree of coincidence S between the pattern to be evaluated and the reference pattern is calculated in the first embodiment described above. However, in the present embodiment, a method will be described wherein in addition to the calculation of the degree of coincidence S, an array D is converted into an image which is displayed in such a manner as to be superposed on an inspection image, thereby visually displaying how much and how a pattern to be evaluated coincides (or does not coincide) with a design pattern thereof.

Figure 5:
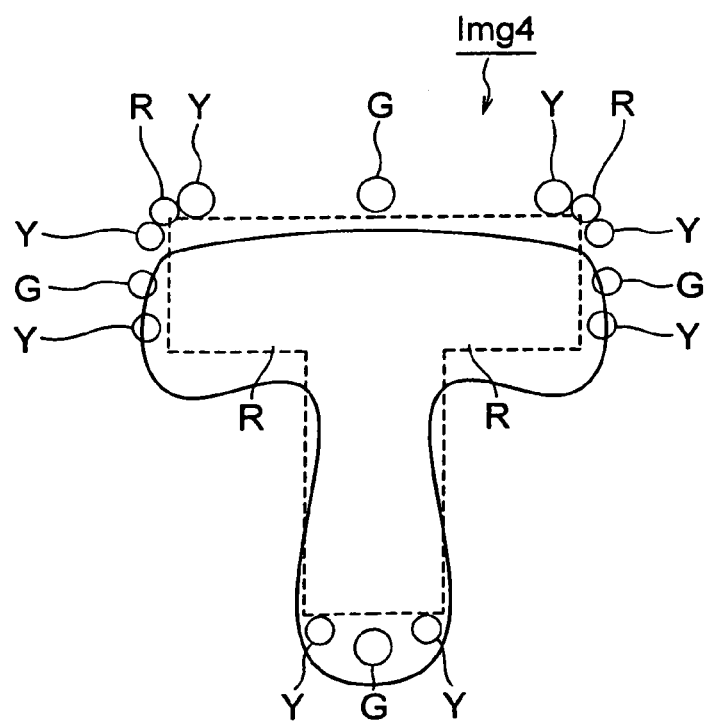
FIG. 5 is a schematic diagram showing one example of an index color image obtained according to a second embodiment of the present invention.

As described in the above first embodiment, the array data D can not be displayed as an image as it is because it contains a distance value as an element. It is also impossible to simply superpose the array data D on the inspection image as it is because its edge is detected with an accuracy of $1/10$ pixels. Thus, the array is divided on the basis of a 10×10 area to define a pixel, and the sum of the areas is further converted into an 8-bit integer, thereby executing the image conversion processing using that value as a pixel value. For easier visual recognition, an 8-bit gray scale is converted into an index color image referring to a proper color table, and displayed in such a manner as to be superposed on the inspection image. FIG. 5 schematically shows one example of an image in which the index color image thus converted is superposed on the inspection image. In an expression mode as in FIG. 5, an edge point is based on a unit of one pixel, and it is thus impossible to express an accurate position of the edge, but it is possible to easily recognize which part of the edge is deflected from design data to what degree. In a superposed image Img4 shown in FIG. 5, it is obvious that parts indicated by a sign R (red) are close to the design pattern, and as the sign changes from Y (yellow) to G (yellow green) that indicate colors of shorter wavelengths, there is more deviation from the design pattern.

In the present embodiment, the array data D is finally converted into an image and displayed as the image. However, when high shape evaluation accuracy is not strongly required, the edges of the pattern to be evaluated and the design pattern, and the result of the array conversion processing are treated as images, such that the array data D is provided as a distance/edge image from the beginning.

(3) Third Embodiment

Image data can be easily generalized as array data. In the following, the array data is treated as the image data for simplification of explanation. Therefore, pointer coordinates of an array are described as image coordinates of an image, and an array value is described as a gradation value of the image. Moreover, design data has been rendered into a design pattern in advance.

In the first and second embodiments described above, the relative positions of a pattern to be evaluated and the design pattern are determined by, for example, a normalized correlation method, and the degree of coincidence of shapes in this positional relation is evaluated. However, an optimum positional relation may be obtained by referring to an arbitrary standard, one or a plurality of obtained numerical values such as a sum S of elements of an array D. To this end, the relative positions of the pattern to be evaluated and the design pattern are scanned and the procedure described in the first embodiment is then repeated, thereby obtaining for each relative position numerical values such as 1) the sum of element values,
2) the dispersion of element values, and
3) the number elements whose element values are 0.

Thus, for example, if a relative position which minimizes the sum of the element values is obtained, the matching of the pattern to be evaluated and the design pattern can be implemented. The result of this matching may be different from the result obtained by ordinary correlative matching, and the result of the matching according to the method of the present embodiment may be preferred depending on the object of an inspection. If other rules are applied, a greater variety of needs can be met.

(4) Fourth Embodiment

In the present embodiment, a case will be described wherein design data is weighted. The weight may be input by an operator during an inspection, or may be previously input in the design data and read by a computer when it is used as a pattern for rendering. In any case, if the influence of array conversion processing of pattern components such as sides or corners of a specified design pattern is incorporated with specified weight and calculation is then performed, different results can be obtained.

(5) Fifth Embodiment

Figure 6:
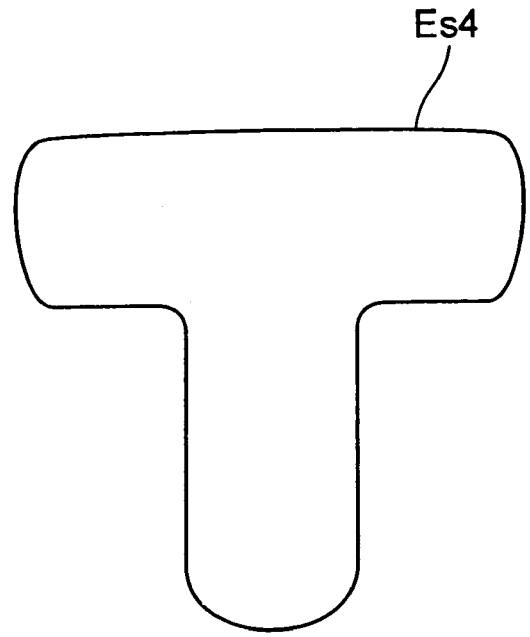
FIG. 6 is a diagram showing one example of the edge of an inspection image to which a fifth embodiment of the present invention is applied.
Figure 7:
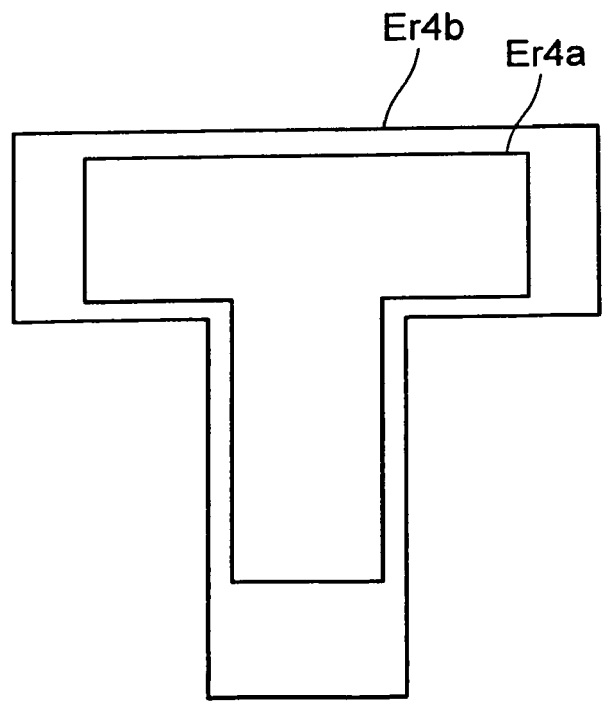
FIG. 7 is a diagram showing one example of a design pattern to which the fifth embodiment of the present invention is applied.
Figure 8:
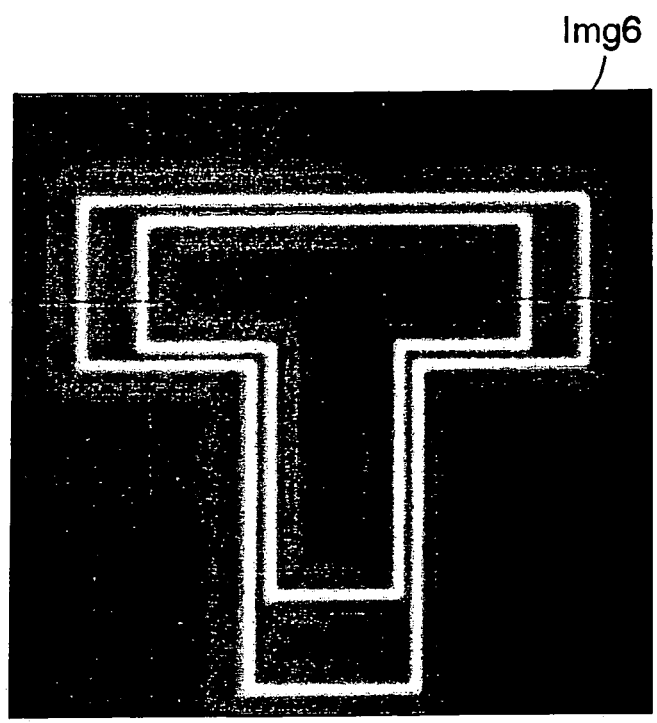
FIG. 8 is an array-converted image of the design pattern shown in FIG. 7.
Figure 9:
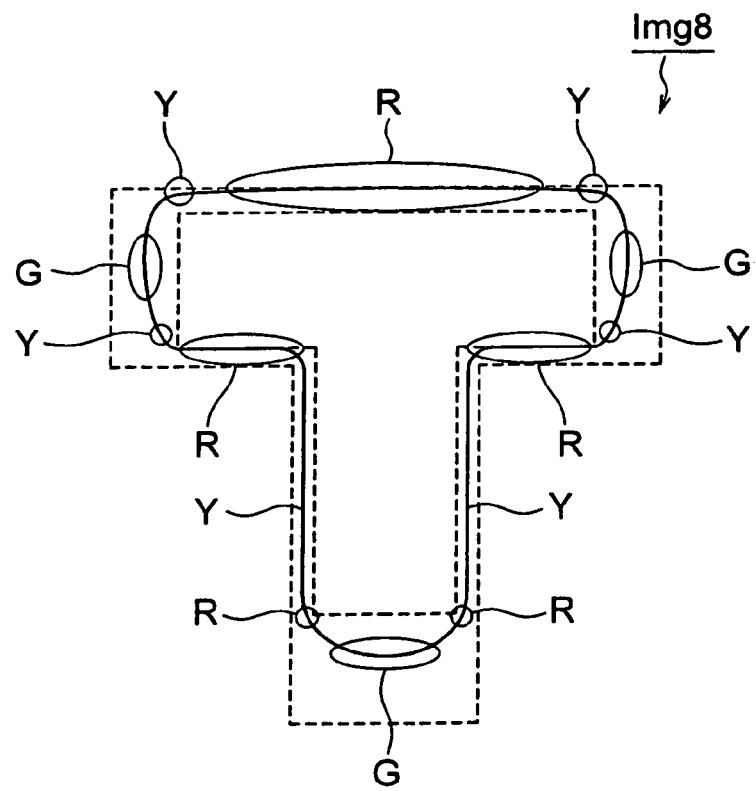
FIG. 9 is a diagram showing one example of a distance/edge image obtained according to the fifth embodiment of the present invention.

In the present embodiment, a case will be described wherein design data contains a maximum value and a minimum value of allowable dimensions. Since a specific procedure is substantially the same as that in the first embodiment described above, processing results are shown in FIGS. 6 to 9. That is, FIG. 6 again shows the same inspection image as the inspection image shown in FIG. 2, and FIG. 7 shows a design pattern including a minimum value (Er4a) and a maximum value (Er4b) of allowable dimensions. The minimum value (Er4a) and the maximum value (Er4b) correspond to, for example, array data corresponding to an upper limit value and array data corresponding to a lower limit value, respectively. FIG. 8 is a diagram showing an array obtained through image conversion processing of the design pattern in FIG. 7. Further, FIG. 9 schematically shows one example of an image in which an index color image with the array shown in FIG. 7 is superposed on the inspection image.

(6) Sixth Embodiment

The present embodiment is characterized in that a value which can be calculated using a function expression is employed as a new distance value when, in the third embodiment described above, an optimum positional relation is obtained by referring to an arbitrary standard, one or a plurality of obtained numerical values (e.g., a sum S of elements of an array D) which represent the degree of coincidence in shape between a pattern to be evaluated and a design pattern in a given positional relation.

Not only in a case where the shape of the pattern to be evaluated is complicated but also in a case where a taken image of a product pattern judged as nondefective is used as a reference pattern and the magnification of the product pattern is low, the density of the edge of the reference pattern is high, and therefore, elements of an array data generated by array conversion processing are almost uniform. This results in a problem of lower matching accuracy. In such a case, in the present embodiment, array data is generated after a value calculated in the following equation is defined as a new distance value, in order to exaggerate and thereby make clear a difference in shape in the reference pattern.

$$A \times \exp(-C \times D) \quad \text{Equation (1)}$$

Here, A is an arbitrary value, C is a constant number as damping coefficient of an exponential function, and D is a distance between the shape of the pattern to be evaluated and the reference pattern. In this case, if a value corresponding to the crude density of the pattern to be evaluated is selected as the constant number C, for example, if a greater value of C is set for a denser pattern, an accurate result of pattern matching can be obtained.

(7) Seventh Embodiment

A seventh embodiment of the present invention will be described referring to FIGS. 10 to 15. The present embodiment is characterized in that there are previously prepared a reference pattern as a pattern which provides an evaluation standard of a pattern to be evaluated, and parameters called an allowable value, and these are used to generate an allowable range of the pattern to be evaluated (this can also be called "allowable range of the shape of the pattern to be evaluated"), and then an obtained inclusive relation between the allowable range and the pattern to be evaluated is used to judge whether or not the pattern to be evaluated is good.

Figure 10:
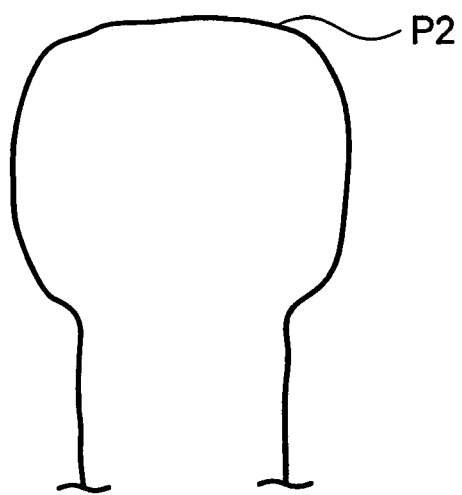
FIG. 10 is a diagram showing a part of an edge in one example of the pattern to be evaluated.
Figure 11:
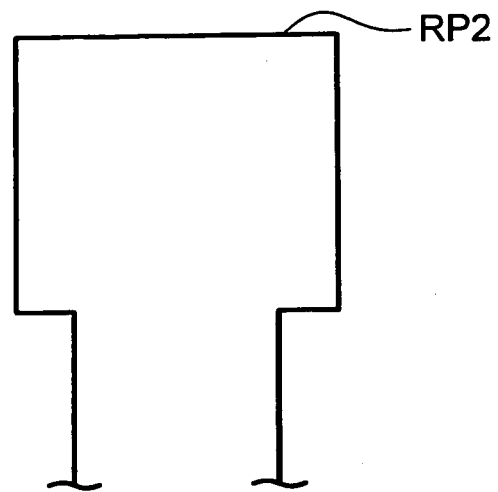
FIG. 11 is a diagram showing a part of an edge of a reference pattern of the pattern shown in FIG. 10.

FIG. 10 is a diagram showing a part of an edge of a pattern P2 which is one example of the pattern to be evaluated, and FIG. 11 is a diagram showing a part of an edge of a reference pattern RP2 of the pattern P2 shown in FIG. 10. In the present embodiment, the reference pattern RP2 is a design pattern based on design data for the pattern to be evaluated P2. The reference pattern is not limited to the design pattern and may be an arbitrary pattern as long as it provides an evaluation standard of the pattern to be evaluated, and data on simulation results can also be used, for example.

Figure 12:
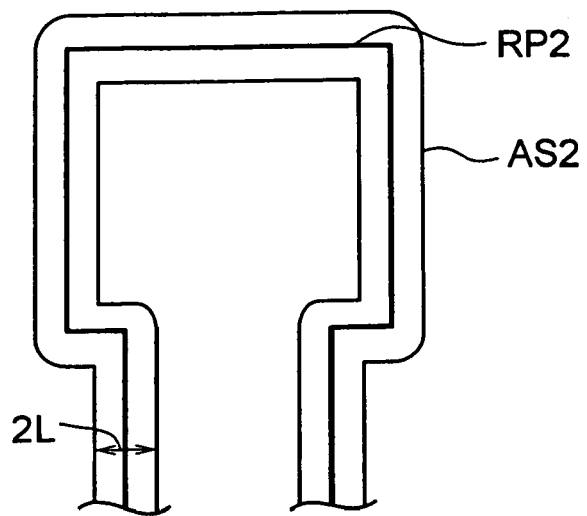
FIG. 12 is a diagram showing one example of an allowable range defined by the edge of the reference pattern and a distance from the reference pattern.
Figure 13:
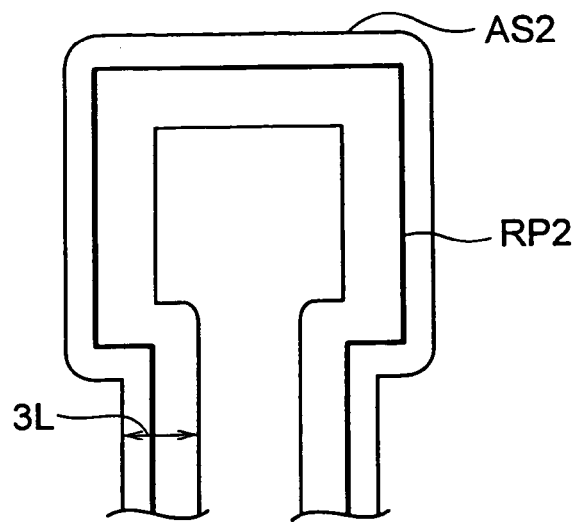
FIG. 13 is a diagram showing another example of the allowable range defined by the edge of the reference pattern and the distance from the reference pattern.

In the present embodiment, a distance L from the edge of the reference pattern RP2 is set to be an allowable value as parameters. Therefore, the allowable range of the reference pattern RP2 is generated as a set of all points kept away by the distance L from the edge of the reference pattern RP2 shown in FIG. 11. Apart from the method wherein the point set is specified as the allowable range, any method may be used, such as a method wherein the pattern RP2 shown in FIG. 11 is subjected to distance conversion processing, and from the result of this processing, the edge lines of the distance L are obtained inside and outside the reference pattern RP2, thereby defining an area between these two edge lines as an allowable range. In the present embodiment, attention should be paid to the fact that the allowable range of the pattern to be evaluated P2 is defined by the distance L from the edge of the reference pattern RP2, and this distance L is a value previously given as an allowable value during the evaluation of the pattern P2. That is, this distance L is a value decided as a specification for shape judgment in accordance with the pattern to be evaluated. One example of the allowable range thus generated is shown in FIG. 12. Since the allowable value is the distance L both inside and outside the pattern, an allowable range AS2 shown in FIG. 12 is generated so as to form a zone having a width of 2 L. The allowable value does not have to be common inside and outside the pattern. For example, as in an allowable range AS4 shown in FIG. 13, different allowable values can be set inside and outside the pattern so as to have an allowable value of 2 L inside the pattern and an allowable value of L outside the pattern, such that a zonal area having a width of 3 L may be generated as a whole. Moreover, different allowable values can be set for the respective components of the pattern in accordance with the requirements and specification of the pattern without being limited to the inside and outside of the pattern.

Figure 14:
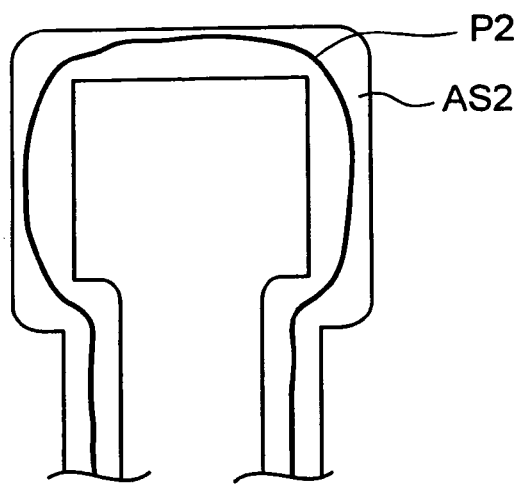
FIG. 14 is a diagram showing one example wherein a pattern to be evaluated is judged to be nondefective because the whole edge of the pattern to be evaluated is within the generated allowable range of the pattern to be evaluated.
Figure 15:
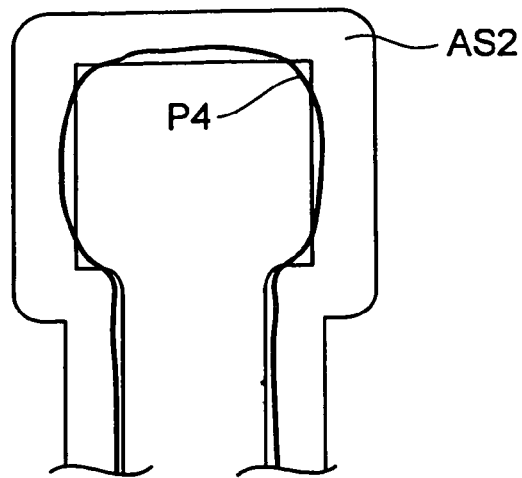
FIG. 15 is a diagram showing one example wherein a pattern to be evaluated is judged to be defective because the whole edge of the pattern to be evaluated is not within the generated allowable range of the pattern to be evaluated.

Next, for example, a check is made to see whether the edge of the pattern to be evaluated is within the allowable range of the pattern to be evaluated generated by the method described above, thus judging whether or not the shape of the pattern to be evaluated is good. More specifically, the relative position of the edge of the pattern to be evaluated P2 is scanned, for example, with respect to the allowable range AS2, thereby calculating such a relative position that the edge of the pattern to be evaluated P2 may be totally within the allowable range AS2. As shown in FIG. 14, when the pattern to be evaluated P2 is within the allowable range AS2 at a given relative position, the pattern to be evaluated P2 is accepted and judged as nondefective. On the other hand, as shown in FIG. 15, when this relative position is not obtained, the pattern to be evaluated P2 is not accepted and judged as defective.

(8) Eighth Embodiment

An eighth embodiment of the present invention will be described referring to FIGS. 16 to 20. The present embodiment is characterized in that the edge of a reference pattern is convoluted with a predefined unit pattern to generate an allowable range.

Figure 16:
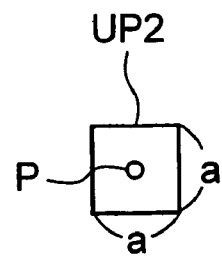
FIG. 16 is a diagram showing one example of a unit pattern.
Figure 17:
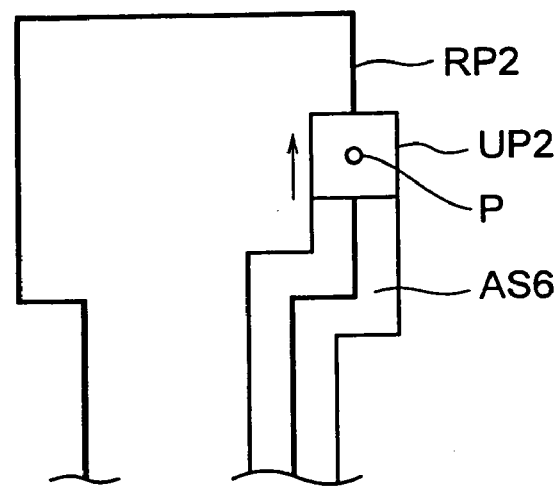
FIG. 17 is an explanatory diagram showing a method of generating an allowable range using the unit pattern according to an eighth embodiment of the present invention.

One example of the unit pattern is shown in FIG. 16. A unit pattern UP2 shown in this drawing is a square with a length a on a side. In addition to the length a on a side, the unit pattern UP2 is provided with coordinates of a point P which is an arbitrary point inside the square and which intersects with the edge of the reference pattern, and the value of the length a and the coordinate position of the point P are allowable values. Next, as shown in FIG. 17, the unit pattern UP2 is adjusted to a reference pattern RP2 at the point P so that the point P is superposed on the edge of the reference pattern RP2, and then the unit pattern UP2 is moved along the edge of the reference pattern RP2 so that the point P tracks the edge of the reference pattern RP2. If the track drawn by the edge of the unit pattern UP2 at this time is recorded, an allowable range AS6 including a zonal area with a width of "a" is generated, as shown in FIG. 18.

Figure 18:
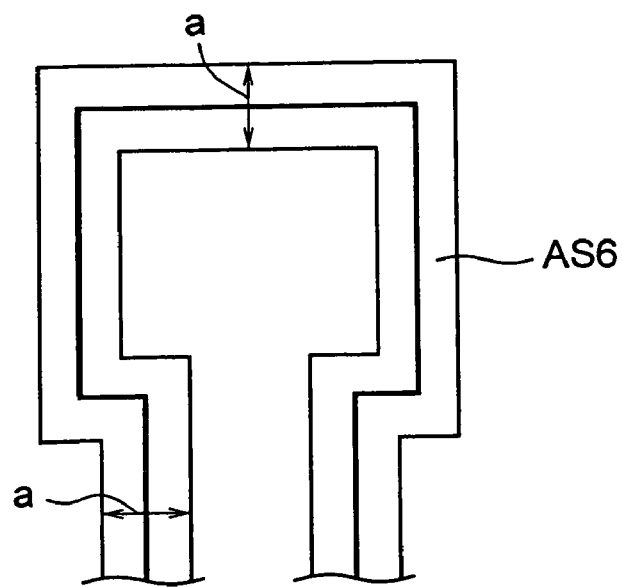
FIG. 18 is a diagram showing one example of the allowable range generated using the unit pattern shown in FIG. 16.

The allowable range AS6 shown in FIG. 18 has angularly shaped corners, which makes it apparently different from the allowable range AS2 in FIG. 12.

Subsequently, with respect to the allowable range AS6 thus generated, the shape of the pattern to be evaluated can be judged as to whether or not it is good by the method described in the seventh embodiment.

Figure 19:
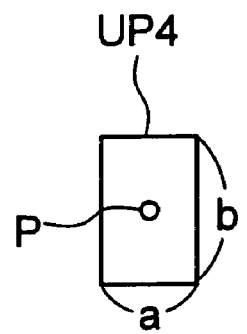
FIG. 19 is a diagram showing another example of the unit pattern.
Figure 20:
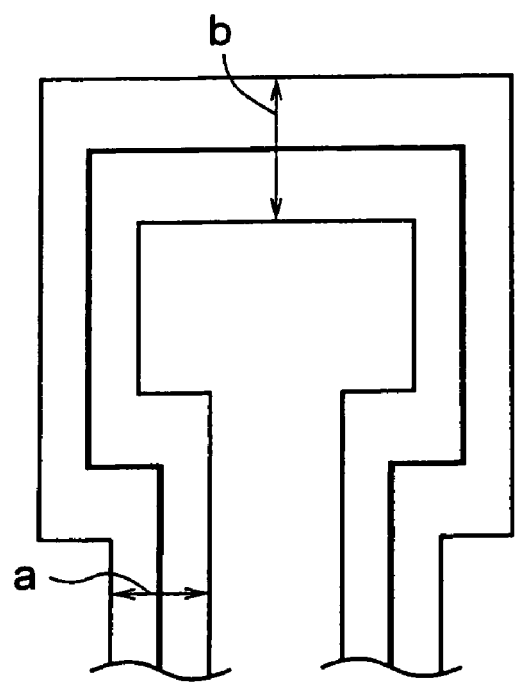
FIG. 20 is a diagram showing one example of the allowable range generated using the unit pattern shown in FIG. 18.

In the above description, the unit pattern is illustrated as square, but is not naturally limited to the square shape, and a circular or elliptical shape can be used in addition to the square shape. One example of a rectangular unit pattern is shown in FIG. 19, and an allowable range generated by use of a unit pattern UP4 in FIG. 19 is shown in FIG. 20. It is to be noted that if the circular or elliptical unit pattern is employed, an allowable range can be generated which has round corners as in the allowable range AS2 in FIG. 12.

(9) Ninth Embodiment

In the embodiments described above, the relative positions of an allowable range generated from a reference pattern and of a pattern to be evaluated are scanned without previously matching the pattern to be evaluated and the reference pattern, in order to verify the inclusive relation between them in all positional relations. In contrast, the present embodiment is characterized in that the pattern to be evaluated is matched with the reference pattern before the generation of the allowable range. This makes it possible to judge whether or not the pattern to be evaluated is good by simply checking the inclusive relation at the position where the matching has been carried out in advance. In this case, design data on the pattern to be evaluated can be used as the reference pattern.

(10) Tenth Embodiment

In the present embodiment, there will be described a method of carrying out a judgment according to the seventh embodiment over a pattern to be evaluated matched with a reference pattern according to the first embodiment described above.

Figure 21:
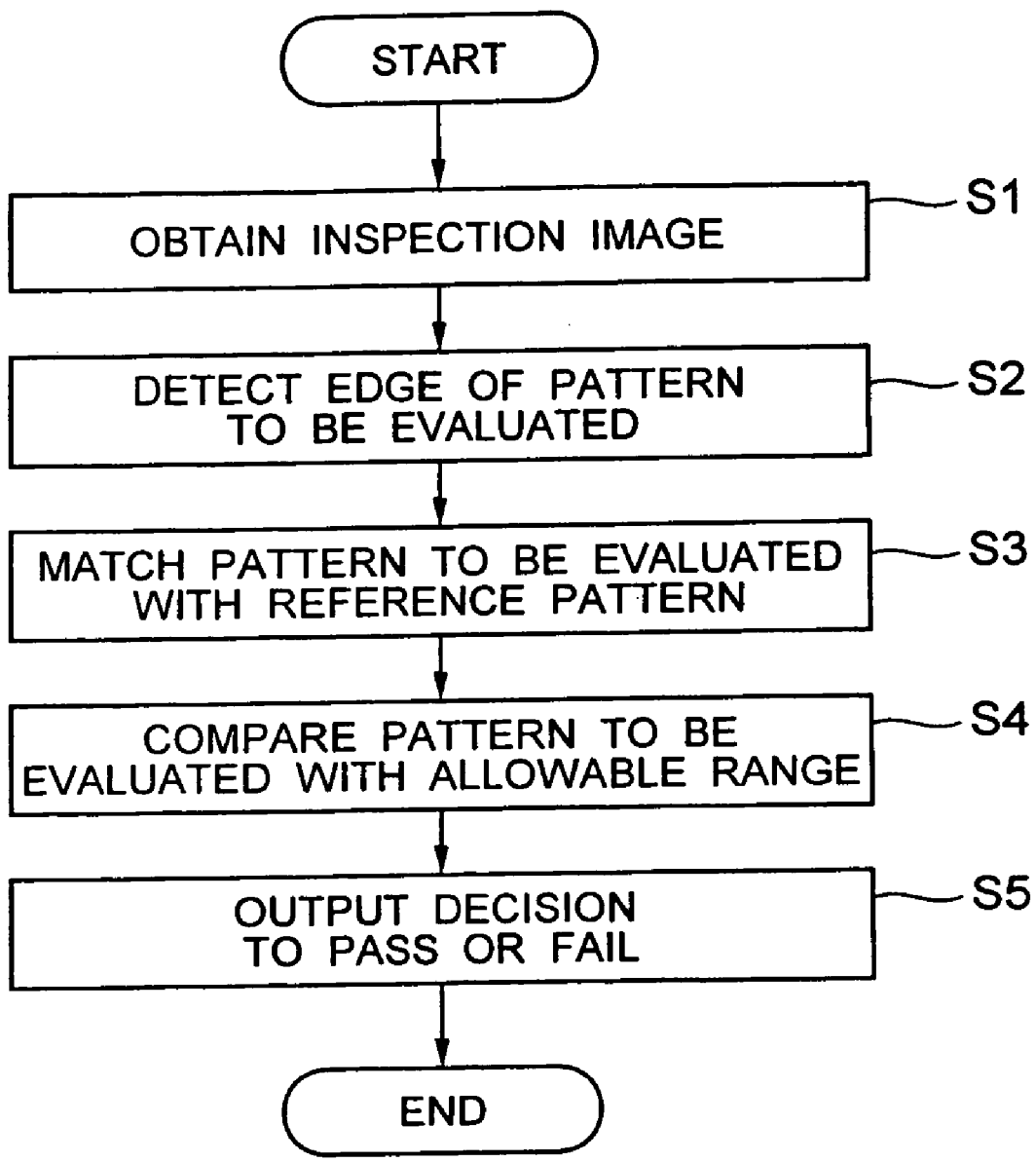
FIG. 21 is a flowchart showing a schematic procedure of a pattern evaluation method according to a tenth embodiment of the present invention.

FIG. 21 is a flowchart showing a schematic procedure of a pattern evaluation method according to the present embodiment.

Figure 22:
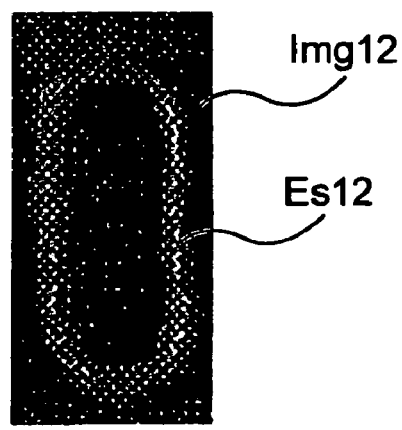
FIG. 22 is a diagram showing a detected edge shape of one example of an elliptical evaluation target pattern.

First, an SEM image of the pattern to be evaluated is obtained by, for example, a CD-SEM (step S1), and edge thereof is detected (step S2). One example of the detected edge is shown in FIG. 22. In the example in this drawing, the edge Es12 of an elliptical evaluation target pattern P12 is shown in an inspection image Img12. The edge may be detected by use of any method, but it is desirable to use a method proposed in U.S. Ser. No. 10/252,521 capable of detecting an edge on the whole periphery of a pattern with sub-pixel accuracy without designating an ROI. The entire contents of this US application are incorporated in the present specification by reference.

Figure 23:
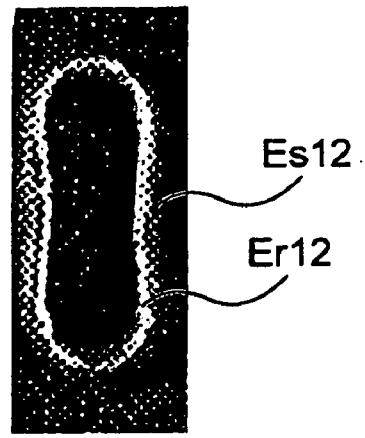
FIG. 23 is a diagram showing an edge shape of a reference pattern of the pattern to be evaluated in FIG. 22 together with the edge shape of the pattern to be evaluated.

Next, the pattern to be evaluated P12 is matched with the reference pattern according to the first embodiment (step S3). As the reference pattern, a shape predicted by a simulation of the pattern to be evaluated is used here. The reference pattern of the pattern to be evaluated P12 obtained by the simulation is shown by an edge Er12 in FIG. 23.

Next, an allowable range is defined for the pattern to be evaluated P12 by use of the procedure according to the seventh embodiment described above, and compared with the pattern to be evaluated P12 (step S4), thereby judging whether or not the pattern to be evaluated P12 is good (step S5). One example of the allowable range defined for the pattern to be evaluated P12 is shown by sign AS12 in FIG. 24. Depending on whether or not the pattern to be evaluated P12 is within this allowable range AS12, it is possible to judge whether or not the pattern to be evaluated P12 is acceptable.

Figure 24:
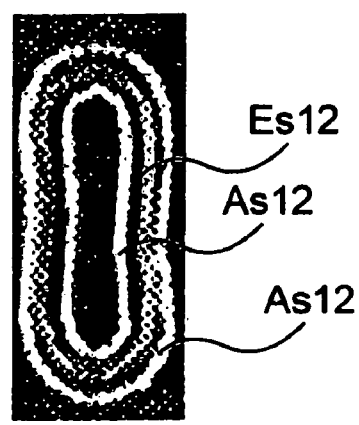
FIG. 24 is a diagram showing one example of an allowable range defined for the pattern to be evaluated in FIG. 22 together with the edge shape of the pattern to be evaluated.

Regarding the allowable range of the pattern to be evaluated, different unit patterns can be employed to define different allowable ranges. This makes it possible to judge whether or not the pattern to be evaluated is good on different judgmental standards. For example, when the allowable range AS12 shown in FIG. 24 is defined, a circle with a radius of 25 nm is employed as the unit pattern. However, if a circle with a larger radius is used as the unit pattern, a looser judgment is made. On the other hand, if a circle with a smaller radius is used as the unit pattern, a stricter judgment can be made.

Thus, according to the present embodiment, it is possible to judge with high accuracy whether or not a pattern shape dependent on open or short defects is good.

(11) Program

Procedures of the pattern evaluation method and pattern matching method described above may be incorporated in a program, and read in a computer as recipe files and executed thereby. This allows the pattern evaluation method and pattern matching method described above to be achieved using a general-purpose computer. Moreover, the procedures of the pattern evaluation method and pattern matching method described above may be stored in a recording medium such as a flexible disk or a CD-ROM as a program to be executed by a computer, and read in the computer and executed thereby.

The recording medium is not limited to a portable medium such as a magnetic disk or an optical disk, and may be a fixed recording medium such as a hard disk drive or memory.

Further, the program incorporating the procedures of the pattern evaluation method and pattern matching method described above may be distributed via a communication line (including radio communications) such as the Internet. Still further, the program incorporating the procedures of the pattern evaluation method and pattern matching method described above may be distributed via a wired line or wireless line such as the Internet, or contained in a recording medium for distribution, in an encrypted, modulated or compressed state.

(12) Method of Manufacturing Semiconductor Device

If the pattern evaluation method and pattern matching method described above are applied to a method of manufacturing a semiconductor device, a semiconductor device can be manufactured with high throughput and yield.

What is claimed is:

1. A pattern evaluation method comprising causing a computer to perform operations of:
    detecting an edge of a pattern to be evaluated;
    detecting an edge of a reference pattern, the reference pattern serving as an evaluation standard of the pattern to be evaluated and being defined by one or more parameters indicating an allowable degree of the pattern to be evaluated;
    generating an allowable range of the pattern to be evaluated by superimposing a unit pattern on the detected edge of the reference pattern and tracking the detected edge of the reference pattern with the unit pattern to generate the allowable range;
    obtaining a relative positional relation between the edge of the pattern to be evaluated and the allowable range to judge an inclusive relation between the edge of the pattern to be evaluated and the allowable range; and
    judging whether or not the pattern to be evaluated is good on the basis of an obtained result of judging the inclusive relation.

2. The pattern evaluation method according to claim 1, wherein the parameters are a distance of an arbitrary value common on at least one of the inside and outside of an edge point of the reference pattern with respect to at least one of components of the reference pattern, and
    the allowable range is generated by setting a range kept away by the arbitrary distance from the edge point of the reference pattern to the inside and outside of the reference pattern.

3. The pattern evaluation method according to claim 1, wherein the parameters are a value which specifies the shape of an arbitrarily shaped unit pattern as well as position coordinates of an arbitrary point within the shape.

4. A pattern evaluation method comprising causing a computer to perform operations of:
    detecting an edge of a pattern to be evaluated;
    detecting an edge of a reference pattern, the reference pattern serving as an evaluation standard of the pattern to be evaluated and being defined by one or more parameters indicating an allowable degree of the pattern to be evaluated;
    matching the pattern to be evaluated with the reference pattern;
    generating an allowable range of the pattern to be evaluated by superimposing a unit pattern on the detected edge of the reference pattern and tracking the detected edge of the reference pattern with the unit pattern to generate the allowable range;
    superimposing the edge of the pattern to be evaluated on the allowable range on the basis of the result of the matching to judge an inclusive relation between the edge and the allowable range; and
    judging whether or not the pattern to be evaluated is good on the basis of an obtained result of judging the inclusive relation.

5. A non-transitory computer-readable recording medium storing a program to cause a computer to execute a pattern evaluation method, the pattern evaluation method comprising:
    detecting an edge of a pattern to be evaluated;
    detecting an edge of a reference pattern, the reference pattern serving as an evaluation standard of the pattern to be evaluated and being defined by one or more parameters indicating an allowable degree of the pattern to be evaluated;
    generating an allowable range of the pattern to be evaluated by superimposing a unit pattern on the detected edge of the reference pattern and tracking the detected edge of the reference pattern with the unit pattern to generate the allowable range;
    obtaining a relative positional relation between the edge of the pattern to be evaluated and the allowable range to judge an inclusive relation between the edge of the pattern to be evaluated and the allowable range; and
    judging whether or not the pattern to be evaluated is good on the basis of an obtained result of judging the inclusive relation.

6. A non-transitory computer-readable recording medium storing a program to cause a computer to execute a pattern evaluation method, the pattern evaluation method comprising:
    detecting an edge of a pattern to be evaluated;
    detecting an edge of a reference pattern, the reference pattern serving as an evaluation standard of the pattern to be evaluated and being defined by one or more parameters indicating an allowable degree of the pattern to be evaluated;
    matching the pattern to be evaluated with the reference pattern;
    generating an allowable range of the pattern to be evaluated by superimposing a unit pattern on the detected edge of the reference pattern and tracking the detected edge of the reference pattern with the unit pattern to generate the allowable range;
    superimposing the edge of the pattern to be evaluated on the allowable range on the basis of the result of the matching to judge an inclusive relation between the edge and the allowable range; and
    judging whether or not the pattern to be evaluated is good on the basis of an obtained result of judging the inclusive relation.

* * * * *